(12) United States Patent
Barriere et al.

(10) Patent No.: US 9,093,381 B2
(45) Date of Patent: Jul. 28, 2015

(54) METHOD FOR FORMING A SEED LAYER FOR THE DEPOSITION OF A METAL ON A SUBSTRATE

(75) Inventors: Clément Barriere, Sydenham (GB); Pierre Fau, Toulouse (FR); Bruno Chaudret, Vigoulet Auzil (FR); Olivier Margeat, Marseilles (FR)

(73) Assignees: STMICROELECTRONICS (TOURS) SAS, Tours (FR); CENTRE NATIONAL DE LA RECHERCHE SCIENTIFIQUE, Paris Cedex (FR)

( * ) Notice: Subject to any disclaimer, the term of this patent is extended or adjusted under 35 U.S.C. 154(b) by 1339 days.

(21) Appl. No.: 12/935,186

(22) PCT Filed: Mar. 30, 2009

(86) PCT No.: PCT/FR2009/050524
§ 371 (c)(1),
(2), (4) Date: Dec. 1, 2010

(87) PCT Pub. No.: WO2009/125143
PCT Pub. Date: Oct. 15, 2009

(65) Prior Publication Data
US 2011/0117271 A1 May 19, 2011

(30) Foreign Application Priority Data
Mar. 28, 2008 (FR) ...................... 08 52045

(51) Int. Cl.
*H01L 21/288* (2006.01)
*C23C 18/16* (2006.01)
*C23C 18/18* (2006.01)
*C23C 18/20* (2006.01)
*H01L 21/768* (2006.01)

(52) U.S. Cl.
CPC ............ *H01L 21/288* (2013.01); *C23C 18/168* (2013.01); *C23C 18/1682* (2013.01); *C23C 18/1696* (2013.01); *C23C 18/1698* (2013.01); *C23C 18/1889* (2013.01); *C23C 18/208* (2013.01); *H01L 21/76873* (2013.01); *H01L 21/76874* (2013.01)

(58) Field of Classification Search
CPC .............. C23C 18/168; C23C 18/1682; C23C 18/1696; C23C 18/1698
USPC ........... 427/126.2, 430.1, 419.1, 443.2, 374.1
See application file for complete search history.

(56) References Cited

U.S. PATENT DOCUMENTS

| | | |
|---|---|---|
| 2005/0281952 A1 | 12/2005 | Xu et al. |
| 2006/0141155 A1 | 6/2006 | Gordon et al. |
| 2007/0235876 A1* | 10/2007 | Goldstein ..................... 257/758 |
| 2008/0064205 A1* | 3/2008 | Dominguez et al. .......... 438/653 |
| 2008/0160204 A1* | 7/2008 | Lavoie et al. ................. 427/431 |

FOREIGN PATENT DOCUMENTS

WO WO 2006012052 A 2/2006

OTHER PUBLICATIONS

International Search Report dated Oct. 23, 2009 from corresponding International Application No. PCT/FR2009/050524 filed Mar. 30, 2009.

* cited by examiner

*Primary Examiner* — Dah-Wei D Yuan
*Assistant Examiner* — Nga Leung V Law
(74) *Attorney, Agent, or Firm* — Allen, Dyer, Doppelt, Milbrath & Gilchrist, P.A.

(57) ABSTRACT

A method for forming, on a substrate, a seed layer enabling the subsequent deposition of a metal layer, including the step of immersing the substrate in a bath containing a material from the ethoxysilane or siloxane family and a copper or nickel amidinate.

20 Claims, 3 Drawing Sheets

METHOD FOR FORMING A SEED LAYER FOR THE DEPOSITION OF A METAL ON A SUBSTRATE

CROSS REFERENCE TO RELATED APPLICATIONS

This application is a U.S. National Stage patent application based on PCT application number PCT/FR2009/050524, filed on Mar. 30, 2009, entitled "Method For Forming A Priming Layer For Depositing A Metal On A Substrate", which application claims the priority benefit of French patent application number 08/52045, filed on Mar. 28, 2008, entitled "Method For Forming A Priming Layer For Depositing A Metal On A Substrate," which is hereby incorporated by reference to the maximum extent allowable by law.

BACKGROUND OF THE INVENTION

1. Field of the Invention

The present invention generally relates to a substrate metallization method and, more specifically, to a method for forming a seed layer enabling the subsequent deposition of a metal.

2. Discussion of the Related Art

Components formed in integrated circuits are generally interconnected by means of metal tracks, for example, made of copper, formed at the surface of a substrate.

There exist many methods for forming such tracks. One of them is to perform an electroless deposition of copper on the substrate. An "electroless" deposition is an autocatalytic deposition performed without using electrodes.

Before performing an electroless deposition, it is necessary to form, on the substrate to be metalized, a seed layer which allows a good bonding on the substrate and which forms a seed for the autocatalytic reaction. Known methods for forming this type of seed layer carry out expensive operations, for example, series of operations of physical deposition, for example, physical vapor depositions (PVD), and etching operations, for example, plasma etchings. Further, several steps are generally necessary to form, on the one hand, a layer of a material ensuring the adherence to the substrate and, on the other hand, seeds of a material enabling the autocatalytic deposition of the metal. Generally, the material ensuring the bonding to the substrate is a material based on tantalum nitride (TaN) or on titanium nitride (TiN) and the material enabling the autocatalytic reaction of the metal is a material based on palladium (Pd), tin (Sn), and/or ruthenium (Ru). It should also be noted that a disadvantage of physical deposition methods is that many of them require substrate-by-substrate processings.

SUMMARY OF THE INVENTION

There thus is a need for a simple method for forming, on a substrate, a seed layer for an electroless deposition with a good adherence to the substrate. It is also desirable to provide a method enabling a collective processing of several substrates.

There also is a need for a method enabling a conformal deposition on surfaces with significant reliefs, for example, in vias. At least one embodiment of the present invention provides forming a catalytic adherence layer by immersing one or several substrates in a single bath comprising a mixture of a copper or nickel compound and of a compound enabling adherence to the substrate.

Thus, an embodiment provides a method for forming, on a substrate, a seed layer enabling the subsequent deposition of a metal layer, comprising the step of immersing the substrate in a bath containing a material from the ethoxysilane or siloxane family and a copper or nickel amidinate.

According to an embodiment, the subsequent deposition is an electroless deposition.

According to an embodiment, the bath is maintained at a temperature ranging between 80 and 130° C., preferably 110° C., and a hydrogen atmosphere is maintained above the bath to have a total pressure ranging between 2,000 and 4,000 hectopascals, preferably 3,000 hectopascals, the substrate being immersed for several hours, preferably for approximately eight hours.

According to an embodiment, said material is tetraethoxysilane (TEOS).

According to an embodiment, the copper or nickel amidinate concentration in the TEOS ranges between 15 grams per liter and the saturation concentration of amidinate in TEOS.

According to an embodiment, the substrate is made of a material, or is coated with a material, from the group comprising silicon oxide, silicon, glass, benzocyclobutene (BCB), and conductive materials.

According to an embodiment, the immersion step is followed by a venting, then by an anneal step, at a temperature ranging between 250 and 350° C., preferably approximately 300° C., under a hydrogen and argon flow for a duration of a few hours, preferably approximately three hours.

According to an embodiment, the substrate comprises trenches and/or vias.

According to an embodiment, the bath comprises a photosensitive compound.

Another embodiment provides a pre-processing agent applied to a substrate intended to be covered with a metal layer, formed of a solvent from the family of ethoxysilanes or siloxanes and of a copper or nickel amidinate.

The foregoing objects, features, and advantages of the present invention will be discussed in detail in the following non-limiting description of specific embodiments in connection with the accompanying drawings.

DETAILED DESCRIPTION

As usual in the representation of integrated circuits, the various drawings, and especially the cross-section views illustrating manufacturing steps, are not to scale.

Figure 1:
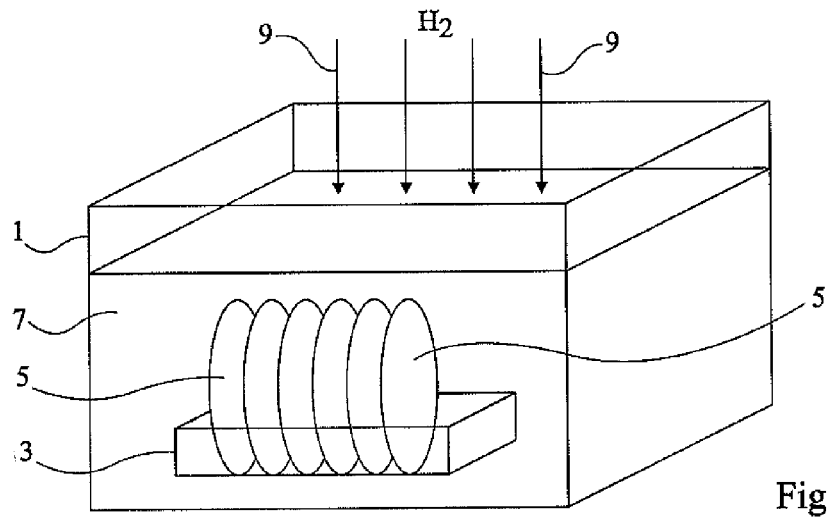
FIG. 1 illustrates a step of the forming of a seed layer for an electroless deposition according to an embodiment of the present invention.

FIG. 1 illustrates a step of the forming of a seed layer for an electroless deposition according to an embodiment of the present invention. In a container 1 is immersed a boat 3 in which are arranged several substrates 5 having surfaces or surface portions to be metalized. Container 1 is filled with a bath 7 which comprises a mixture of a copper compound and of a compound enabling adherence to the substrate.

The adherence compound is a compound from the family of ethoxysilanes or siloxanes, for example, tetraethoxysilane (TEOS) having the following semi-structural formula:

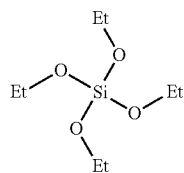

where Et designates an ethyl group.

TEOS, used as a solvent, forms a rough agent of adherence to the substrate.

The copper compound is a copper amidinate. As an example, this copper amidinate may be copper (N,N'-diisopropyl-acetamidinate), of molecular formula $[Cu(^iPr-amd)]_2$ and having the following semi-structural formula:

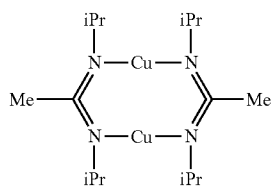

where Me designates a methyl group and iPr designates an isopropyl group. It should be noted that the used amidinate may be any known type of copper amidinate.

This reaction results in the forming on substrate(s) 5 of a seed layer formed of an intimate mixture of copper and silica. This layer is then vented, then, preferably, annealed.

Figure 2:
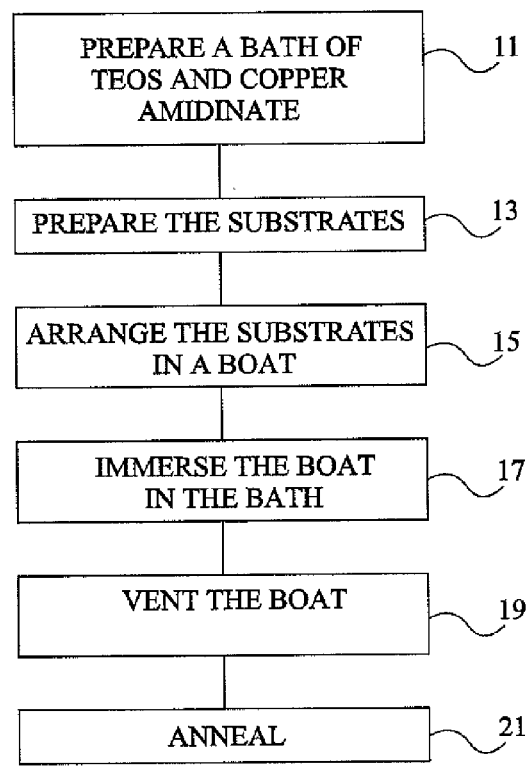
FIG. 2 shows a flowchart of a method according to an embodiment of the present invention.

FIG. 2 shows a flowchart of a method for forming an electroless deposition seed layer according to an embodiment of the present invention.

In a first step 11, a bath containing a mixture of copper amidinate and of TEOS is prepared. Preferably, the copper amidinate concentration in the TEOS will range between 15 and 150 grams per liter (up to the saturation concentration of amidinate in the solvent).

At step 13, the substrates are prepared for their processing (plasma cleaning ...).

At step 15, the substrates are arranged in a boat.

At step 17, the boat is immersed in the bath for several hours, for example from two to fifteen hours, and preferably for eight hours. Above the container, a hydrogen atmosphere is maintained at a pressure ranging between 1,000 and 3,000 hectopascals (total pressure ranging between 2,000 and 4,000 hectopascals), and preferably 2,000 hectopascals (total pressure of 3000 hectopascals), as illustrated in FIG. 1 by arrows 9. During the immersion, the bath is maintained at a temperature ranging between 80 and 130° C. and, preferably, at a temperature of approximately 110° C. to obtain a good adherence of the seed layer formed on the substrate.

At step 19, the boat(s) are taken out of the container and vented.

At step 21, the substrates, maintained or not in the boat, are submitted to an anneal to densify the obtained layer. The anneal is performed at a temperature ranging between 200 and 350° C., preferably 300° C., for a time ranging between two and four hours, for example, three hours, under a hydrogen and/or argon flow. This step is optional in that the seed layer formed during the immersion also densifies when exposed to air. The anneal however has the advantage of accelerating this phenomenon.

By selecting the following conditions:
25 grams per liter of copper amidinate in the TEOS;
15 hours of immersion in the TEOS and copper amidinate bath;
bath maintained at 110° C. during the immersion;
hydrogen atmosphere maintained at 2,000 hectopascals (total pressure of 3000 hectopascals) above the container;
exposure of the seed layer to air before anneal; and
anneal, after immersion, at 300° C. for 3 hours,
the inventors have obtained, on the substrate, a seed layer having a thickness of approximately 0.3 µm.

Figure 3A:
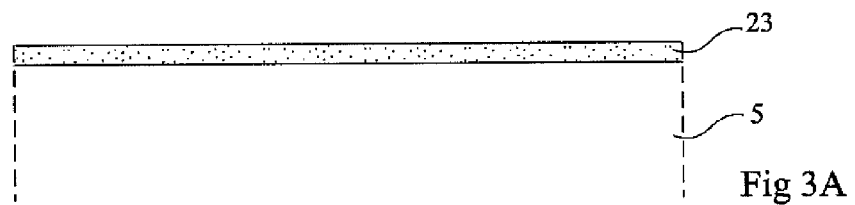
FIGS. 3A to 3C are cross-section views illustrating an example of application of the method to the forming of metal tracks on an integrated circuit.
Figure 3B:
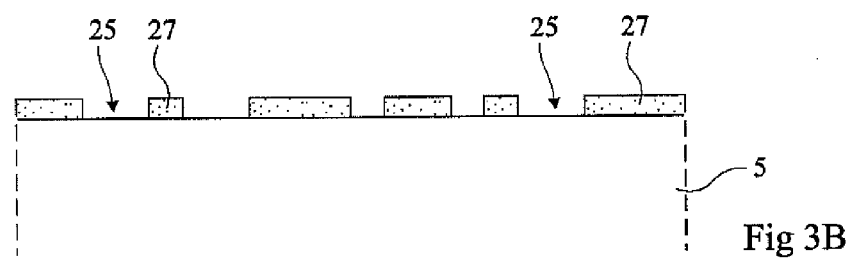
Figure 3C:
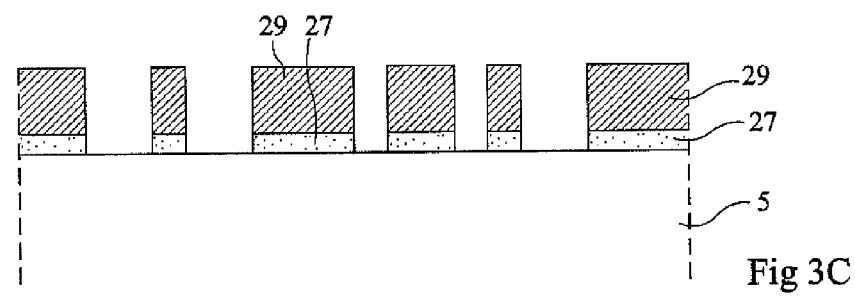

FIGS. 3A to 3C are cross-section views illustrating an example of application of an embodiment of the seed layer deposition method to the forming of metal tracks on an integrated circuit.

FIG. 3A illustrates a substrate 5 coated with a seed layer 23 formed by the method described in relation with FIGS. 1 and 2.

At the step illustrated in FIG. 3B, a photolithography of seed layer 23 has been performed to form openings 25 into this layer and to leave portions 27 thereof at the locations where the tracks are desired. The photolithography may conventionally be performed by means of a mask and/or of an adapted resin to obtain tracks and/or portions 27 of desired dimensions. The etching may be a liquid etching by means of iron chloride $FeCl_3$. As a variation, a photosensitive compound may be added to bath 7 to make seed layer 23 photosensitive and to eliminate certain steps of the photolithography.

Once the photolithography has been performed, the electroless deposition is performed. An electroless copper deposition is here considered as an example. For this purpose, the substrates are dipped into a bath conventionally comprising the following elements:
a copper source, for example, a sulfate salt $CuSO_4$, $5H_2O$;
a reducing agent, for example, formaldehyde (HCOH);
a pH stabilizer (for example, a hydroxide);
complexing agents, for example, EDTA (ethylenediamine tetra-acetic acid, $C_{10}H_{16}N_2O_8$), to avoid any spontaneous copper deposition in the bath;
additives enabling improving the quality of the deposition, for example, surface agents, stabilizers, wetting agents, accelerating and/or slowing agents.

The reactions involved during this step will not be described in further detail, such a reaction being well known by those skilled in the art.

FIG. 3C illustrates the result obtained after having performed the electroless copper deposition on the structure of FIG. 3B. On each of portions 27 is formed a copper portion 29. Copper portions 29 are formed along a direction perpendicular to the surface of substrate 5. Copper portions 29 may have a thickness ranging up to 5 µm.

Thus, conductive tracks are formed on the substrate according to the pattern predefined by photolithography. In the case of FIGS. 3A to 3C, substrate 5 may be a semiconductor wafer, for example, made of silicon, but the present invention also applies to the forming of copper portions on any other type of substrate, for example, on insulating substrates such as glass plates, silicon oxide ($SiO_2$) or benzocyclobutene (BCB) layers, or else on conductive substrates.

FIGS. 4A to 4D are cross-section views illustrating an example of application of the method according to an embodiment to the forming of a track and of a conductive via in an interconnection stack of an integrated circuit.

Figure 4A:
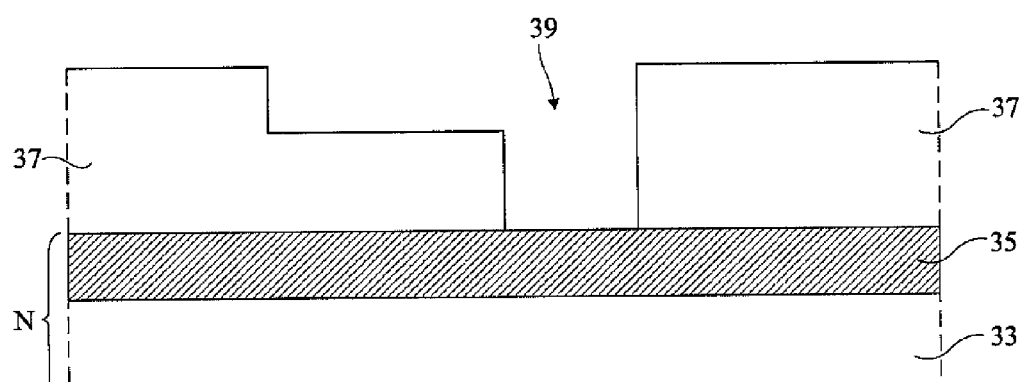
FIGS. 4A to 4D are cross-section views illustrating an example of application of an embodiment of the method to the forming of a conductive track and via in an interconnection stacking of an integrated circuit.

In FIG. 4A, it is started from an interconnection stack in which an interconnection level N is formed, this level comprising an insulating layer 33, for example made of BCB or SiO$_2$, on which is formed a conductive track 35, here shown in cross-section along its length.

On interconnection level N is formed a layer of an insulating material 37 (interconnection level N+1) having its surface etched (opening 39) to define the location of the conductive material of the upper interconnection level (tracks and vias of level N+1).

Figure 4B:
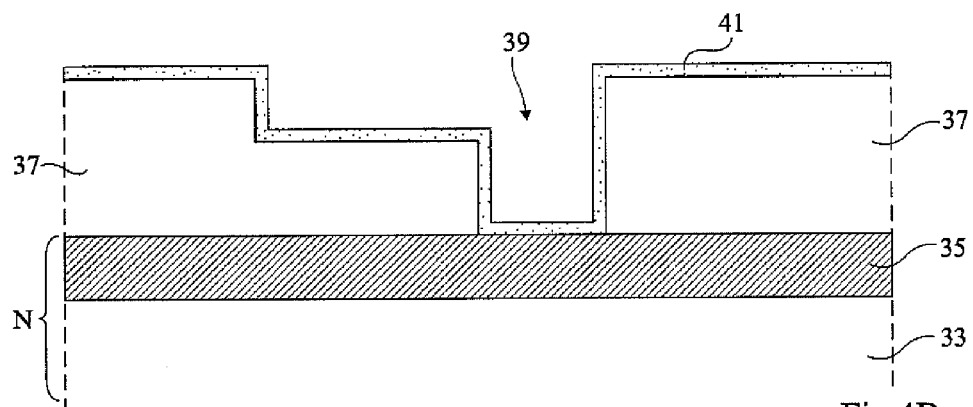

At the step illustrated in FIG. 4B, the structure has been immersed in a bath such as that of FIG. 1 and the above-discussed associated operating mode has been followed. A seed layer 41 is thus obtained on the surface of insulating material 37 and on the walls and the bottom of opening 39.

Figure 4C:
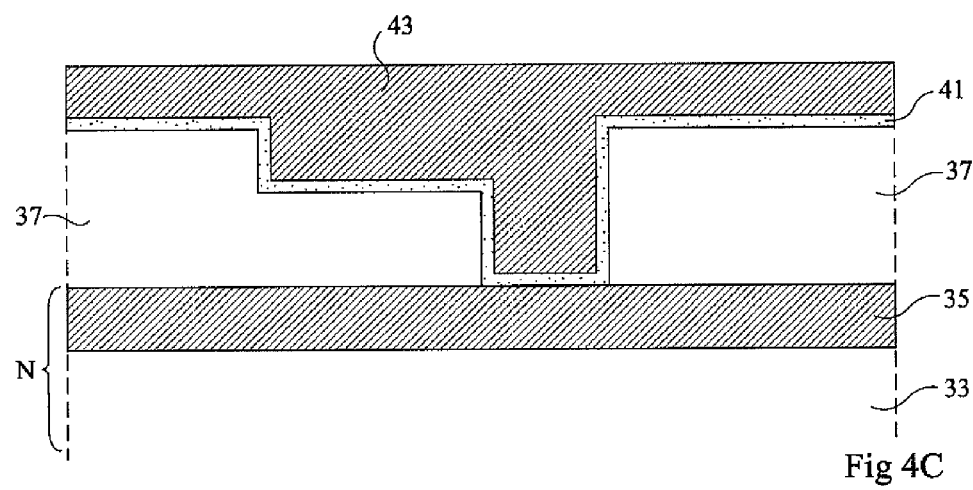

At the step illustrated in FIG. 4C, an electroless deposition, for example, of copper, has been performed from layer 41. This deposition forms, in opening 39 and on layer 41, a copper layer 43.

Figure 4D:
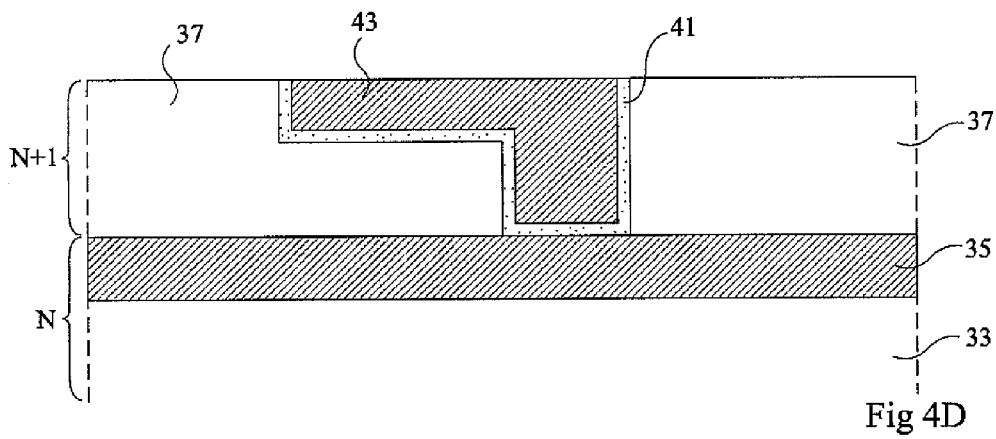

At the step illustrated in FIG. 4D, a chem.-mech. polishing (CMP) of the structure of FIG. 4C has been performed to expose the upper surface of insulating layer 37. Interconnection level N+1 is thus obtained.

It should be understood that this method also applies to the metallization of a substrate having any other shape, for example, of a substrate comprising vias and/or trenches. The method according to an embodiment may also enable the metallization of more complex shapes at the surface of a substrate.

Specific embodiments of the present invention have been described. Different variations and modifications will occur to those skilled in the art. In particular, the method described herein in relation with the forming of a copper-based seed layer on a substrate may be generalized to other metals, and in particular to a nickel-based seed layer. The bath for forming the initial layer will then comprise, to replace the copper amidinate, nickel amidinate.

It should also be noted that the electroless deposition performed on the copper- or nickel based seed layer may be a deposition of any known metal that can be deposited on such a seed layer. As a non-limiting example, copper, nickel, or again platinum may in particular be deposited on a seed layer formed by means of copper amidinate. Copper, nickel, platinum, or again gold may be deposited on a seed layer formed by means of nickel amidinate.

Further, the copper- or nickel-based seed layer may be formed on any other known substrate type, having any kind of stronger or lighter relief.

The seed layer formed according to an embodiment may also be used as a seed layer for electrolytic depositions.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method for forming, on a substrate, a seed layer enabling the subsequent deposition of a metal layer, comprising the step of immersing the substrate in a bath containing a material from the ethoxysilane family and a copper amidinate, wherein a hydrogen atmosphere is maintained above the bath to have a total pressure ranging between 2,000 and 4,000 hectopascals.

2. The method of claim 1, wherein the subsequent deposition is an electroless deposition.

3. The method of claim 1, wherein the bath is maintained at a temperature between 80° C. and 130° C., the substrate being immersed for up to about eight hours.

4. The method of claim 1, wherein said material is tetraethoxysilane (TEOS).

5. The method of claim 4, wherein the copper amidinate concentration in the TEOS ranges between 15 grams per liter and the saturation concentration of amidinate in TEOS.

6. The method of claim 1, wherein the substrate is made of a material, or is coated with a material selected, from the group consisting of silicon oxide, silicon, glass, and benzocyclobutene.

7. The method of claim 1, wherein the immersion step is followed by a venting, then by an anneal step, at a temperature ranging between 250 and 350° C., under a hydrogen and argon flow for a duration of up to about three hours.

8. The method of claim 1, wherein the substrate comprises one of at least trenches and vias.

9. The method of claim 1, wherein
the bath further comprises a photosensitive compound.

10. A method for forming, on a substrate, a seed layer enabling the subsequent deposition of a metal layer, comprising the step of immersing the substrate in a bath containing a material from the ethoxysilane family and a copper amidinate and a photosensitive compound.

11. The method of claim 10, wherein the subsequent deposition is an electroless deposition.

12. The method of claim 10, wherein the bath is maintained at a temperature ranging between 80 and 130° C., and a hydrogen atmosphere is maintained above the bath to have a total pressure ranging between 2,000 and 4,000 hectopascals.

13. The method of claim 10, wherein the material is tetraethoxysilane (TEOS).

14. The method of claim 13, wherein the copper amidinate concentration in the TEOS ranges between 15 grams per liter and the saturation concentration of amidinate in TEOS.

15. The method of claim 10, wherein the substrate is made of a material, or is coated with a material selected from the group consisting of silicon oxide, silicon, glass, and benzocyclobutene.

16. The method of claim 10, wherein the immersion step is followed by a venting, then by an anneal step, at a temperature ranging between 250 and 350° C., under a hydrogen and argon flow for a duration up to about three hours.

17. A method for forming on a substrate, a seed layer enabling the subsequent deposition of a metal layer, comprising the step of immersing the substrate in a bath containing tetraethoxysilane (TEOS) and a copper amidinate.

18. The method of claim 17, wherein the subsequent deposition is an electroless deposition.

19. The method of claim 17, wherein the bath is maintained at a temperature ranging between 80 and 130 degrees C., and a hydrogen atmosphere is maintained above the bath to have a total pressure between 2,000 and 4,000 hectopascals.

20. The method of claim 17, wherein the copper amidinate concentration in the TEOS ranges between 15 grams per liter and the saturation concentration of the amidinate in the TEOS.

* * * * *

UNITED STATES PATENT AND TRADEMARK OFFICE
CERTIFICATE OF CORRECTION

| | | |
|---|---|---|
| PATENT NO. | : 9,093,381 B2 | Page 1 of 1 |
| APPLICATION NO. | : 12/935186 | |
| DATED | : July 28, 2015 | |
| INVENTOR(S) | : Clément Barriere et al. | |

It is certified that error appears in the above-identified patent and that said Letters Patent is hereby corrected as shown below:

ON THE TITLE PAGE

Item 75          Delete: "Sydenham (GB)"
                 Insert --Toulouse (FR)--

Signed and Sealed this
Eighth Day of December, 2015

Michelle K. Lee
*Director of the United States Patent and Trademark Office*